United States Patent
Mallinson

(10) Patent No.: US 12,057,816 B2
(45) Date of Patent: Aug. 6, 2024

(54) AMPLIFIER BIAS CONTROL USING TUNNELING CURRENT

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 357 days.

(21) Appl. No.: 17/737,802

(22) Filed: May 5, 2022

(65) Prior Publication Data

US 2022/0264113 A1 Aug. 18, 2022

Related U.S. Application Data

(63) Continuation of application No. 17/196,914, filed on Mar. 9, 2021, now Pat. No. 11,349,446.

(60) Provisional application No. 62/987,464, filed on Mar. 10, 2020.

(51) Int. Cl.
  *H03F 3/45* (2006.01)
  *H03F 1/02* (2006.01)
  *H03F 1/42* (2006.01)
  *H04N 19/182* (2014.01)

(52) U.S. Cl.
  CPC .......... *H03F 3/45269* (2013.01); *H03F 1/02* (2013.01); *H03F 1/42* (2013.01); *H04N 19/182* (2014.11); *H03F 2200/36* (2013.01)

(58) Field of Classification Search
  CPC .......... H03F 3/45269; H03F 3/45; H03F 1/02; H03F 1/42; H04N 19/182
  See application file for complete search history.

(56) References Cited

U.S. PATENT DOCUMENTS

| | | | | |
|---|---|---|---|---|
| 4,246,544 A * | 1/1981 | Itoh | .......................... | H03F 1/305 330/296 |
| 6,087,897 A * | 7/2000 | Wang | ................... | H03F 3/45479 327/124 |
| 10,837,993 B2 * | 11/2020 | Peng | .................... | H03F 3/45475 |
| 2007/0236289 A1 * | 10/2007 | Iriguchi | .............. | H03F 3/45179 330/253 |
| 2008/0144398 A1 * | 6/2008 | Blodgett | ................... | G11C 7/02 326/29 |
| 2008/0273106 A1 * | 11/2008 | Amini | ..................... | H04N 25/75 330/253 |

* cited by examiner

*Primary Examiner* — Patricia T Nguyen
(74) *Attorney, Agent, or Firm* — Gard & Kaslow LLP

(57) ABSTRACT

An apparatus and method for using the known phenomena of quantum gate tunneling in semiconductor transistors to define the DC state of a charge-coupled amplifier is described. A first stage in which the tunneling current is bipolar (by pairing PMOS and NMOS transistors) in combination with a second stage with a controlled common mode voltage that can be used to control the first stage tunneling current, and thus the common mode voltage at the input. This can be done without the use of additional elements that may degrade performance or power consumption, since the input devices both process the input signal and maintain the DC operating point of the circuit. The approach may be advantageously used not only in charge-coupled amplifiers as described herein, but also in other capacitively coupled circuits such as charge balancing analog to digital converters (ADCs) and digital to analog converters (DACs).

5 Claims, 8 Drawing Sheets

AMPLIFIER BIAS CONTROL USING TUNNELING CURRENT

This application claims priority from Nonprovisional application Ser. No. 17/196,914, filed Mar. 9, 2021, which claims priority from Provisional Application No. 62/987,464, filed Mar. 10, 2020, each of which is incorporated by reference herein in its entirety.

FIELD OF THE INVENTION

The present invention relates generally to signal processing, and more particularly to bias control in signal amplifiers.

BACKGROUND OF THE INVENTION

In signal processing applications requiring the measuring of very small signals in a low bandwidth, it is desirable that there be low noise. However, circuits capable of handling such low bandwidth signals while limiting noise are difficult to implement on silicon chips containing semiconductor devices.

A large number of electrical signals that represent phenomena in the real world often occur at low frequencies. For example, audio signals process signals having frequencies from 20 hertz (Hz) to about 20 kilohertz (KHz). Electroencephalograph (EEG) signals have frequencies from less than 1 Hz to about 500 Hz, and electrocardiogram (ECG) signals have frequencies from a few millihertz to less than 10 Hz. In these examples, and many others, there is no direct current (DC) signal, i.e., a signal having a frequency of zero.

FIG. 1 is a diagram of a simple amplifier circuit 100 of a type that may be used when there is only an alternating current (AC) signal, and no DC signal, according to the prior art. In this case the amplifier U1 may be "(AC) coupled" using a capacitor as shown in FIG. 1. As is well known in the art, when the impedance of the capacitor C1 is less than the impedance (i.e., resistance) of resistor R1, a signal will pass from the input In to the output Out with a gain equal to the inverse of the ratio of the resistor values, i.e., $-R2/R1$. Since the impedance of a capacitor is $1/j\omega C$, the minimum frequency that will pass through the amplifier circuit is $\frac{1}{2}\pi R1C1$.

As is also well known in the art, noise is generated by the components in a circuit and varies with the ambient temperature. Specifically, resistive elements generate a noise "variance" (the square of the voltage of the noise) of 4 kTRB where:

k is the Boltzmann constant, approximately $1.38 \times 10^{-23}$, or 1.38 e−23;
T is the ambient temperature in degrees Kelvin (° K);
R is the resistance of the resistor in ohms; and
B is the bandwidth of the circuit in Hz.

Consequently, if circuit 100 in FIG. 1 is to operate with a specified low noise, then a maximum value of R1 may be calculated. For example, if the total noise voltage in the signal range for 1 Hz to 500 Hz is to be less than 10 nanovolts root mean squared (nV RMS), then:

$$\sqrt{4kTRB} < 10 nV$$

For this to be true, using T=300° K, k=1.38 e−23, and B=500 Hz results in a maximum value of R, $R_{max}$=12 ohms.

Since as above the minimum frequency that will pass through circuit 100 is given by $f_{min}=\frac{1}{2}\pi R1C1$, and R1 can be no larger than 12 ohms, the value of capacitor C1 must be 13 millifarads (mF). It circuit 100 is intended to be implemented on a silicon chip, this is an impractically high value of capacitance, as the largest available values on such chips are generally on the order of 100 picofarads (pF), and a more typical value is about 10 pF.

FIG. 2 is a diagram of another simple amplifier circuit 200 known in the art that may be used with an AC signal in place of amplifier circuit 100 of FIG. 1. Circuit 200 is a "charge domain" amplifier circuit (also known as "charge-coupled" or "capacitively coupled"), as any charge that flows in through capacitor C1 is accumulated on capacitor C2. The gain of circuit 200 is given by the ratio of the capacitances, −C1/C2.

However, in circuit 200 there is no means to define the absolute value of the charge, so that the DC voltage of the circuit (as distinguished from a DC signal) cannot be known. The operation of circuit 200 is dependent only on the change of the capacitor voltages, and not on their absolute value; all that is known is that current flowing in via capacitor C1 must flow out via capacitor C2, so that:

$$dVin/dt \times C1 = dVout/dt \times C2$$

where dV/dt is a first derivative of the voltage over time.

FIG. 3 is a diagram of still another simple amplifier circuit 300 known in the art that may be used with an AC signal, and is intended to remedy the problem of an unknown DC voltage. In circuit 300 resistor R1 ensures that the average value of voltage across the capacitor C2 must be zero, since resistor R1 discharges capacitor C2 with a time constant of R1C2.

As with the capacitor and resistor in circuit 100 of FIG. 1, circuit 300 also creates a high pass filter action at $\frac{1}{2}\pi R_1 C_2$. Since again circuit 300 is intended to operate at as low a frequency as 1 Hz in this example, this implies that if resistor R1 has a resistance of 1 megohm, then the value of capacitor C2 must be 160 nF.

While this is considerably lower than the 13 mF capacitor required in circuit 100 of FIG. 1, it is still too large to conveniently place on a silicon chip. Further, again the gain of the circuit in FIG. 2 is the ratio of C1 to C2 so that for a gain of 10, a reasonable gain to allow succeeding stages to operate at higher noise levels), the value of C1 would need to be 10 times as large as that of C2, i.e., 1.6 uF.

As above, a more typical capacitor value that might be found on a silicon chip is 10 pF. If capacitor C1 has a value of 10 pF in circuit 300, then capacitor C2 will need to have a value of 1 pF so that circuit 300 has a gain of 10. For circuit 300 to then be able to operate at 1 Hz, i.e., $\frac{1}{2}\pi R1C2=1$, the resistance of R1 needs to be 160 gigohms, an exceptionally high value.

Thus, in the prior art signal processing circuits requiring the measuring of very small signals in a low bandwidth with low noise are difficult to implement on silicon chips. Charge-coupled amplifiers are needed to avoid having AC coupling capacitors of impractically large AC coupling capacitors, but require a means to define the DC values of the circuit. However, the means known in the prior art to define the DC value of a charge-coupled amplifier typically results in the need for an impractically high resistor value.

SUMMARY OF THE INVENTION

Described herein is an apparatus and method for using the known phenomena of quantum gate tunneling in a semiconductor circuit to define the DC state of a charge-coupled amplifier.

One embodiment describes a charge-coupled amplifier circuit comprising: a first capacitor having a first end configured to receive an input signal and a second end; a second capacitor having a first end coupled to the second end of the first capacitor and a second end; a first amplifier comprising: a first PMOS transistor having a gate, a drain and a source, the gate and source coupled to the second end of the first capacitor and to a ground; a second PMOS transistor having a gate, a drain and a source, the source coupled to the source of the first PMOS transistor and the gate connected to the ground; an output stage having an input coupled to the drains of the second PMOS transistor and the second NMOS transistor, and an output configured to supply an output signal and coupled to the second end of the second capacitor; a current source connected to a power supply and configured to supply current to the sources of the first and second PMOS transistors; a second amplifier comprising: a first NMOS transistor having a gate, a drain and a source, the drain and the gate coupled to the drain of the first PMOS transistor and the source coupled to the ground; a second NMOS transistor having a gate, a drain and a source, the gate coupled to the gate of the first NMOS transistor, the drain coupled to the input of the output stage and the drain of the second PMOS transistor, and the source coupled to the ground; wherein gate oxide layers on the PMOS and NMOS transistors are of a thickness such that current is able to flow through the gate oxide from a channel beneath the gate oxide; and a control circuit configured to adjust the current that flows through the gate oxide of the first PMOS transistor.

Another embodiment describes differential charge-coupled amplifier circuit comprising: a first capacitor having a first end configured to receive an input signal and a second end; a second capacitor having a first end coupled to the second end of the first capacitor and a second end; a third capacitor having a first end configured to receive an inverted input signal and a second end; a fourth capacitor having a first end coupled to the second end of the third capacitor and a second end; a fifth capacitor having a first end and a second end, the second end coupled to a ground; a first amplifier comprising: a first PMOS transistor having a gate, a drain and a source, the gate coupled to the second end of the third capacitor; a second PMOS transistor having a gate, a drain and a source, the gate coupled to the second end of the first capacitor; a first output stage having an inverting input, a non-inverting input and an output, the inverting input coupled to the first end of the fifth capacitor and the output configured to supply an inverse of an output signal; a first control circuit coupled to the output of the first output stage, the non-inverting input of the first output stage and the drain of the second PMOS transistor and configured to adjust the voltage at the drain of the second PMOS transistor based upon the output of the first output stage; a current source connected to a power supply and configured to supply current to the sources of the first and second PMOS transistors; a second amplifier comprising: a first NMOS transistor having a gate, a drain and a source, the gate coupled to second end of the third capacitor and the gate of the first PMOS transistor, the drain coupled to the drain of the first PMOS transistor and the source coupled to the ground; a second NMOS transistor having a gate, a drain and a source, the gate coupled to the second end of the first capacitor and the gate of the second PMOS transistor, the drain coupled to the drain of the second PMOS transistor, and the source coupled to the ground; a second output stage having an inverting input, a non-inverting input and an output, the inverting input coupled to the first end of the fifth capacitor and the output configured to supply the output signal; a second control circuit coupled to the output of the second output stage, the non-inverting input of the second output stage and the drain of the first NMOS transistor and configured to adjust the voltage at the drain of the first NMOS transistor based upon the output of the second output stage; wherein gate oxide layers on the PMOS and NMOS transistors are of a thickness such that current is able to flow through the gate oxide from a channel beneath the gate oxide.

Still another embodiment describes a charge coupled amplifier circuit, comprising: a first amplifying means for receiving an input signal, the first amplifying means comprising first and second CMOS transistors of a first type, each CMOS transistor of the first type configured to have a gate tunneling current; a second amplifying means for receiving an inverse of the input signal, the second amplifying means comprising first and second CMOS transistors of a second type opposite to the first type, each CMOS device of the second type configured to have a gate tunneling current; the first CMOS transistor of the first type and the first CMOS transistor of the second type coupled to each other to present a first common mode voltage; the second CMOS transistor of the first type and the second CMOS transistor of the second type coupled to each other to present a second common mode voltage; a first output stage configured to generate an output signal from the first common mode voltage; a first control means for changing the first common mode voltage by using the output signal thereby changing the gate tunneling currents of the first CMOS transistor of the first type and the first CMOS transistor of the second type; a second output stage configured to generate an inverse of the output signal from the second common mode voltage; and a second control means for changing the second common mode voltage by using the inverse of the output signal thereby changing the gate tunneling currents of the second CMOS transistor of the first type and the second CMOS transistor of the second type.

DETAILED DESCRIPTION OF THE INVENTION

Figure 1:
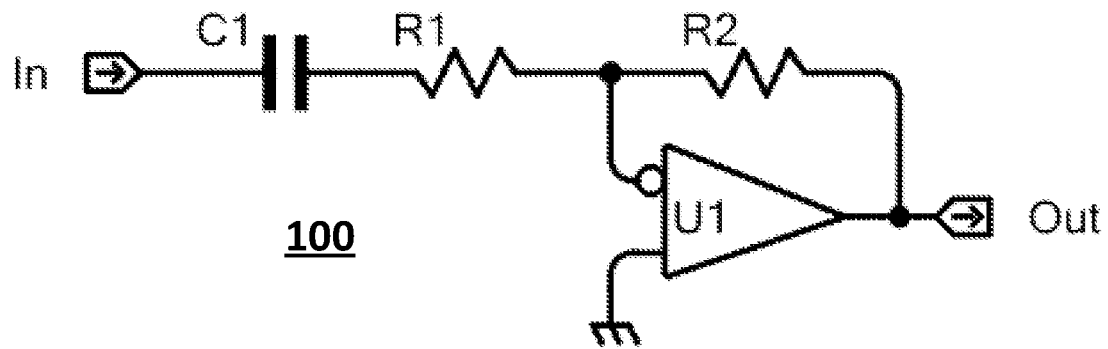
FIG. 1 is a diagram of a simple amplifier circuit of a type that may be used when there is only an alternating current (AC) signal according to the prior art.

Described herein is an apparatus and method for using the known phenomena of quantum gate tunneling in semiconductor transistors to define the DC state of a charge-coupled amplifier. To solve the problem of there being no common mode voltage in prior art charge-coupled amplifiers, the present approach uses a first stage in which the tunneling current is bipolar (by pairing transistors of different types as described herein) in combination with a second stage with an arbitrary, controlled common mode voltage that can be used to control the first stage tunneling current, and thus the common mode voltage at the input. This can be done without the use of additional elements that may degrade performance or power consumption of the circuit, since the input devices do "double duty" by both processing the input signal while maintaining the DC operating point of the circuit.

It will be apparent to those skilled in the art in light of the teachings herein that this approach may be advantageously used not only in charge-coupled amplifiers as described herein, but also in other capacitively coupled circuits such as charge balancing analog to digital converters (ADCs) and digital to analog converters (DACs).

As is well known, circuits on silicon chips often contain metal-oxide-semiconductor field-effect transistors (MOSFETs), a type of insulated-gate field-effect transistor that is fabricated by the controlled oxidation of a semiconductor, i.e., the silicon. MOSFETs are complementary metal-oxide-semiconductor (CMOS) devices, and may be either NMOS or PMOS devices; and NMOS device is constructed with an n-type source and drain and a p-type substrate, while a PMOS device is constructed with a p-type source and drain and an n-type substrate. In an NMOS device, the charge carriers are electrons, while in a PMOS device the charge carriers are holes.

Classically, in a MOSFET, oxidized silicon, called the "gate oxide," is an insulator and prevents charge carriers in a channel under the gate oxide from connecting to the conductive gate above. However, when the gate oxide of a MOSFET device is very thin, on the order of less than about 2 nanometers (nm), a phenomenon known in the art as quantum tunnelling becomes apparent. Quantum effects operating over very small distances allow a certain probability of an electron or hole making a "quantum jump" across the insulating barrier and appearing in the gate.

As is known in the art, the gate oxide on advanced CMOS processes has reached the point, i.e., the gate oxide is thin enough, that an appreciable gate current flows due to this quantum effect. The tunneling current is typically a very low value, being in the femto-amps, but it is predictable and can be used in a circuit.

The present approach recognizes two particular facts. First, the tunneling current of a PMOS and an NMOS device differ in sign: tunneling current (represented as holes in conventional current flow) flows out of a PMOS device gate and into an NMOS device gate. Second, the tunneling current is affected by the source to drain voltage of the device; specifically, the tunneling current is reduced as the source to drain voltage is reduced.

Figure 2:
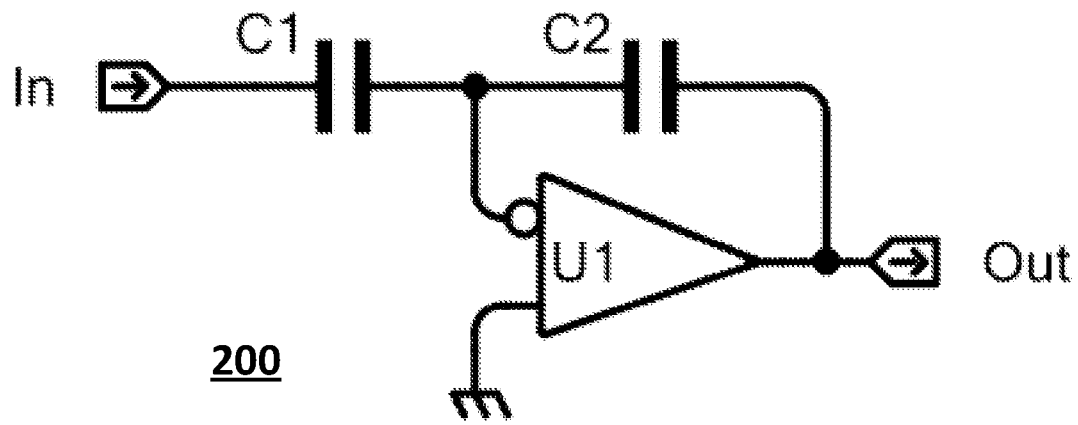
FIG. 2 is a diagram of another simple amplifier circuit of a type that may be used for an AC signal according to the prior art.
Figure 3:
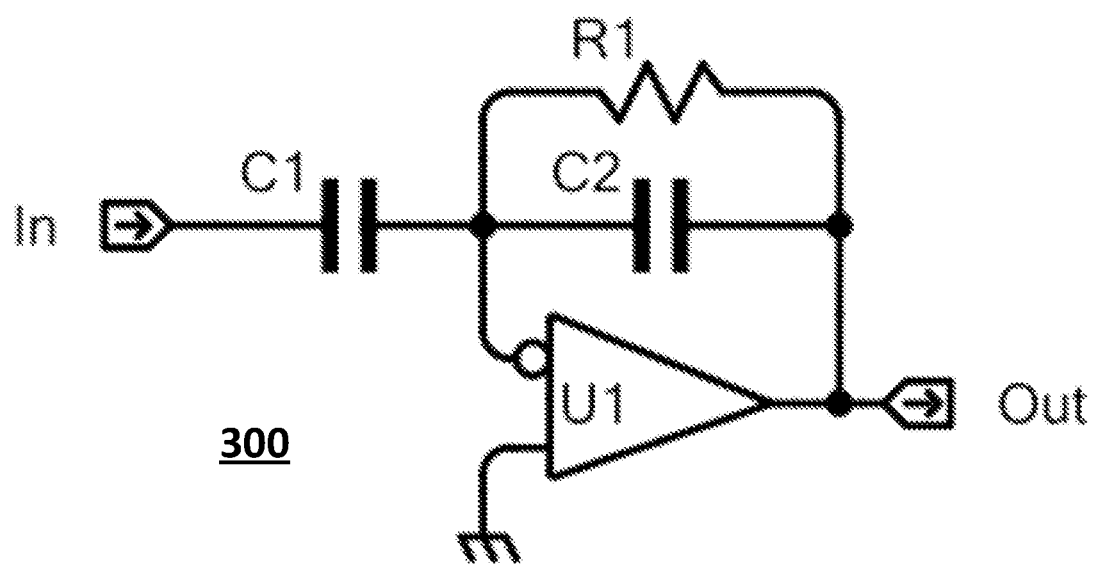
FIG. 3 is a diagram of still simple amplifier circuit of a type that may be used for an AC signal according to the prior art.

Thus, in the present approach an amplifier, such as amplifier U1 in circuit 200 of FIG. 2, may have a dual function, so that in addition to operating as a conventional amplifier it also operates as a DC definition means. This allows a circuit such as circuit 200 of FIG. 2, which appears to lack any DC definition means as it does not have an impedance R1 as shown in circuit 300 of FIG. 3, to define the DC voltage without such an impedance. A circuit constructed according to the present approach does not require any large value resistor and does not limit the low frequency operation.

Figure 4:
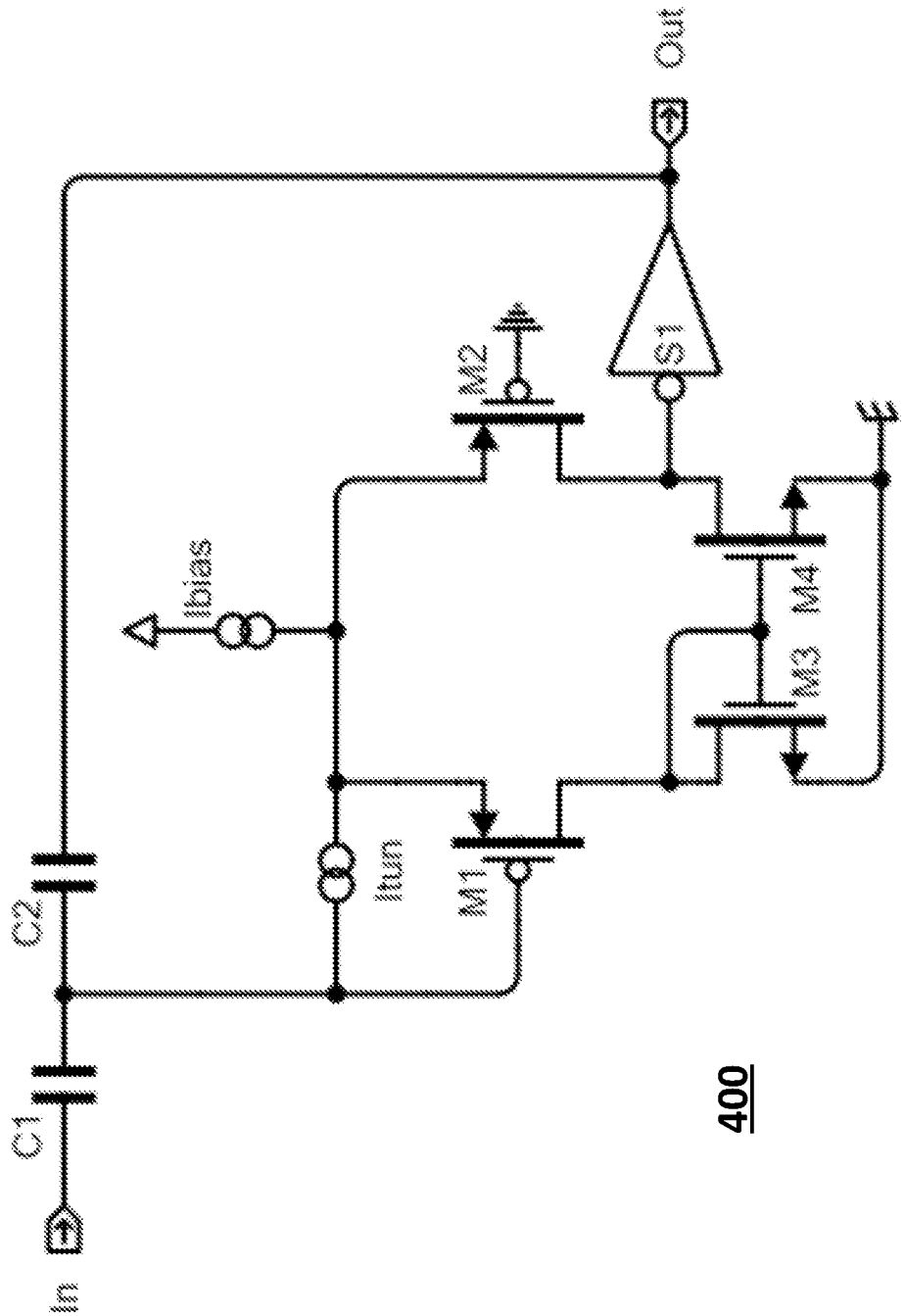
FIG. 4 is a diagram of an amplifier circuit 400 that shows the effect of the quantum gate tunneling current on the DC value of the circuit according to one embodiment.

FIG. 4 is a diagram of an amplifier circuit 400 that shows the effect of tunneling current on the DC value of the circuit according to one embodiment. Circuit 400 includes two capacitors C1 and C2, as in circuit 200 of FIG. 2, and an amplifier that includes an input stage containing PMOS transistors M1 and M2 and an output stage S1. The output stage may be, for example, a push-pull driver with a nominal gain of one. This configuration allows utilization of the tunneling current of the PMOS transistors. Circuit 400 also includes a load network containing NMOS transistors M3 and M4.

A current source Ibias, connected to a positive power supply (often 3.3 volts in semiconductor circuits) provides the amplifier input stage bias current. The current source Itun, which takes a small part of the source current of transistor M1 and directs it to the gate of M1, represents the tunneling current. The tunneling current flows out of the gate of transistor M1 (as above, because it is a PMOS transistor), causing the voltage at the common point of capacitors C1 and C2 (the "common mode" voltage, or voltage at "the C1-C2 node"), which is the input voltage to the amplifier, to rise.

The tunneling current will thus disturb the DC operating point of circuit 400; however, since it only flows in one direction, it will ultimately cause circuit 400 to fail when the voltage at the C1-C2 node, and thus the voltage on the gate of transistor M1, rises out of the common mode range of the amplifier.

Figure 5:
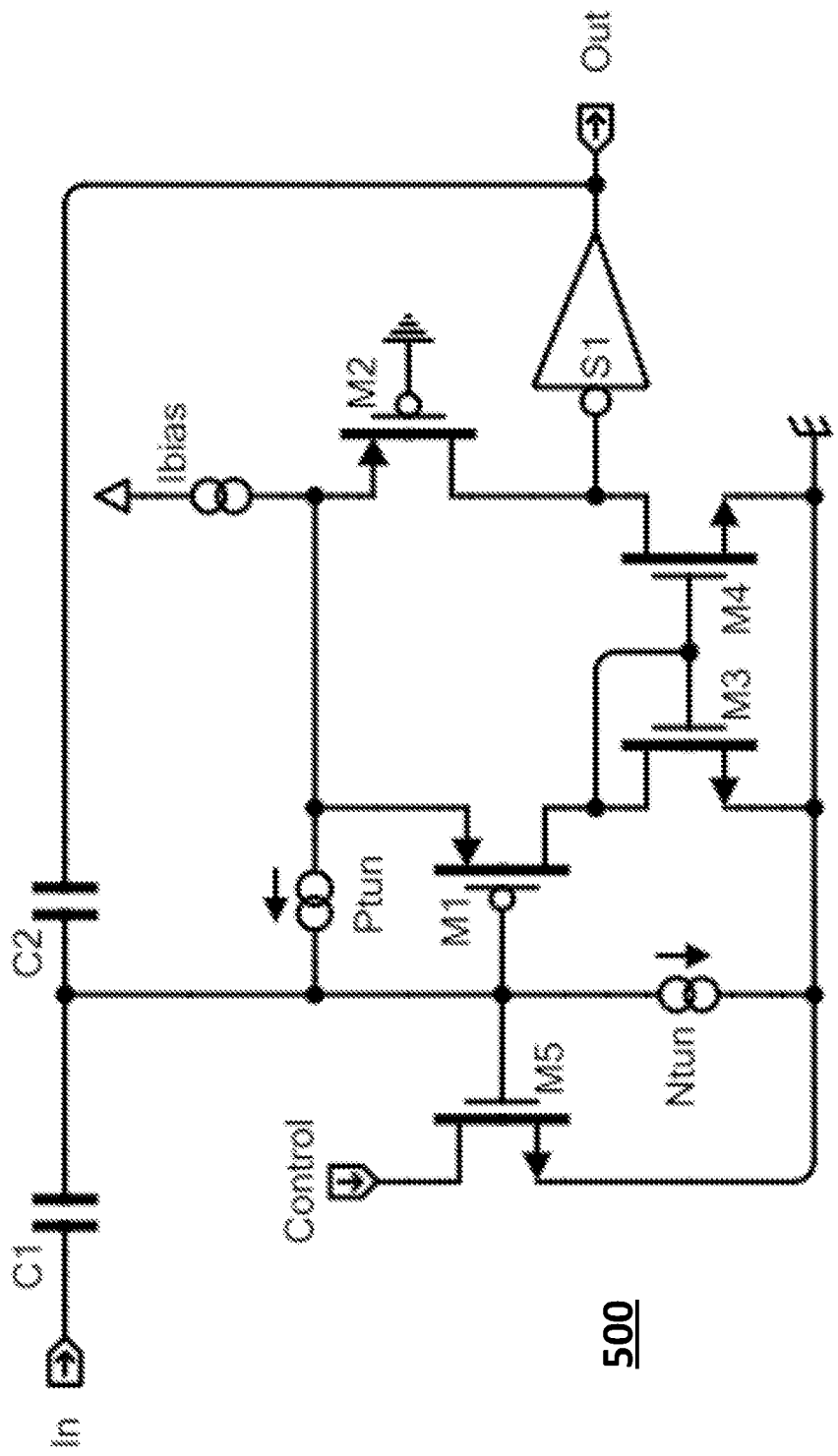
FIG. 5 is a diagram of an amplifier circuit 500 that shows the effect of the quantum gate tunneling current on the DC value of the circuit according to another embodiment.

FIG. 5 is a diagram of an amplifier circuit 500 that shows the effect of the tunneling current on the DC value of the circuit according to another embodiment. Circuit 500 shows one way in which the tunneling current might be prevented from disturbing the DC operating point of the circuit.

In circuit 500 an NMOS transistor M5 is added to circuit 400 of FIG. 4; the gate of transistor M5 is connected to the gate of transistor M1, such that the tunneling current of transistor M5 (which, as above, flows into the gate of an NMOS transistor) counteracts the tunneling current of PMOS transistor M1. The tunneling current of NMOS transistor M5 is represented by the current source Ntun and the tunneling current of PMOS is represented by the current source Ptun. If the tunneling current of transistor M5 can be controlled, for example, by a signal Control applied to the drain of transistor M5 as shown, a servo loop may be created such that the DC value of the C1-C2 node would be defined.

Figure 6:
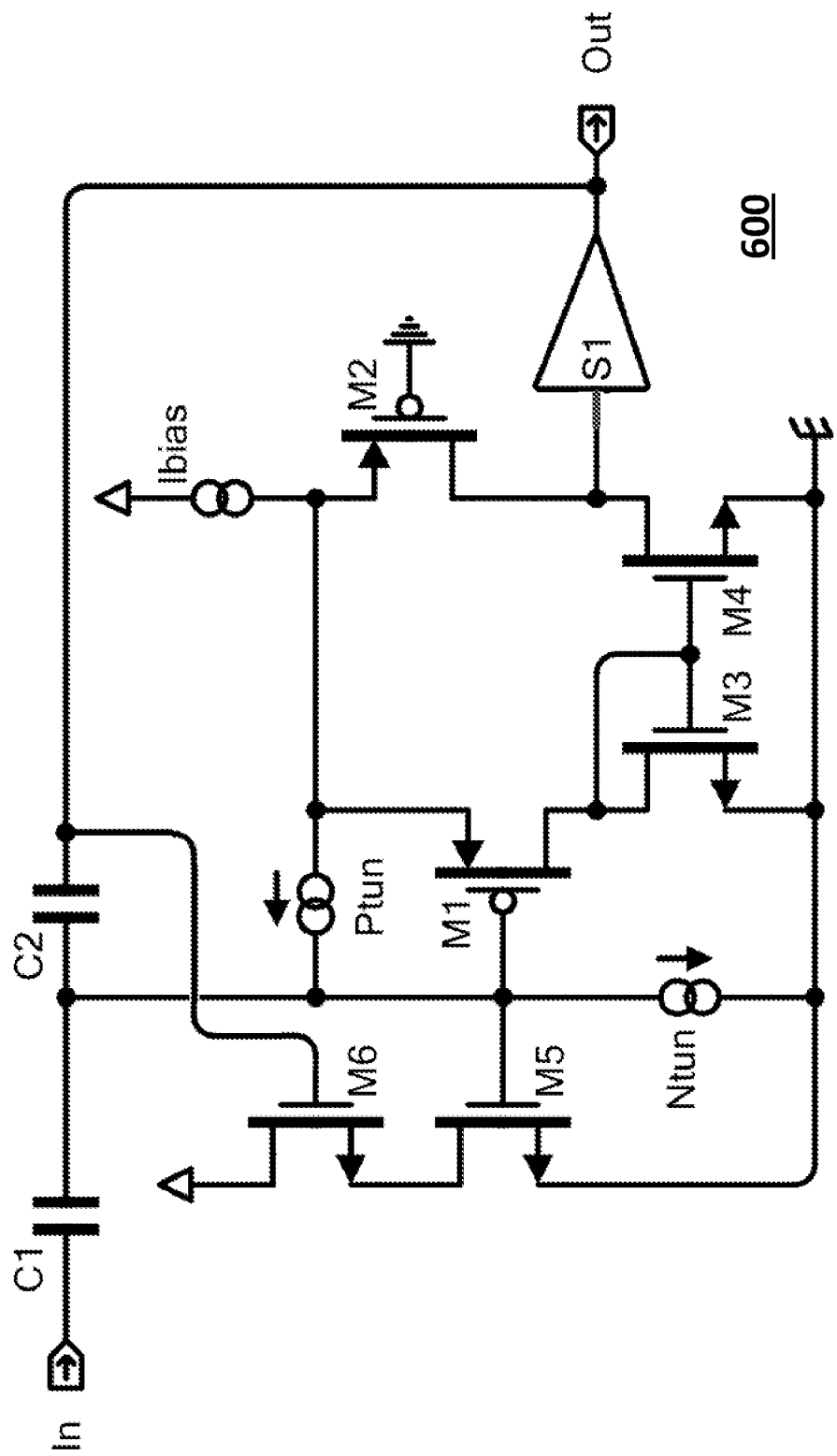
FIG. 6 is a diagram of an amplifier circuit in which quantum gate tunneling is used to control the DC value of the circuit according to one embodiment.

FIG. 6 is a diagram of an amplifier circuit 600 in which quantum gate tunneling is used to control the DC value of the circuit according to one embodiment. As in circuit 500 of FIG. 5, the amplifier includes transistors M1 and M2 and output stage S1, and transistors M3 and M4 are again the load network.

As above, the tunneling current increases with the drain to source voltage. In circuit 600, an additional NMOS transistor M6 is added, its drain connected to the positive power supply, its source connected to the drain of transistor M5, and its gate connected to the output voltage. Transistor M6 thus acts like a sensor of the output voltage; if the output voltage rises too high, transistor M6 lifts up the drain voltage of transistor M5 and causes the tunneling current of M5 to increase so as to bring the output voltage back down and thus establishing a control loop.

One of skill in the art will appreciate that transistor M6 itself also has tunneling current in its gate, but this current does not disturb the common mode voltage since it is provided by the low output impedance output stage S1.

In circuit 600, the amplifier is thus separated from control of the common mode voltage at the C1-C2 node. Additional transistors M5 and M6 have been added to circuit 400 of FIG. 4 to sense the voltage at the C1-C2 node and the output voltage respectively, and cause the tunneling current of transistor M5 to exceed that of the amplifier input transistor M1 if the C1-C2 node voltage rises too high, while dropping if the output of the amplifier is too high. It is the balance of the tunneling currents of transistors M1 and M5 that controls the DC operating point of the charge domain amplifier.

Figure 7:
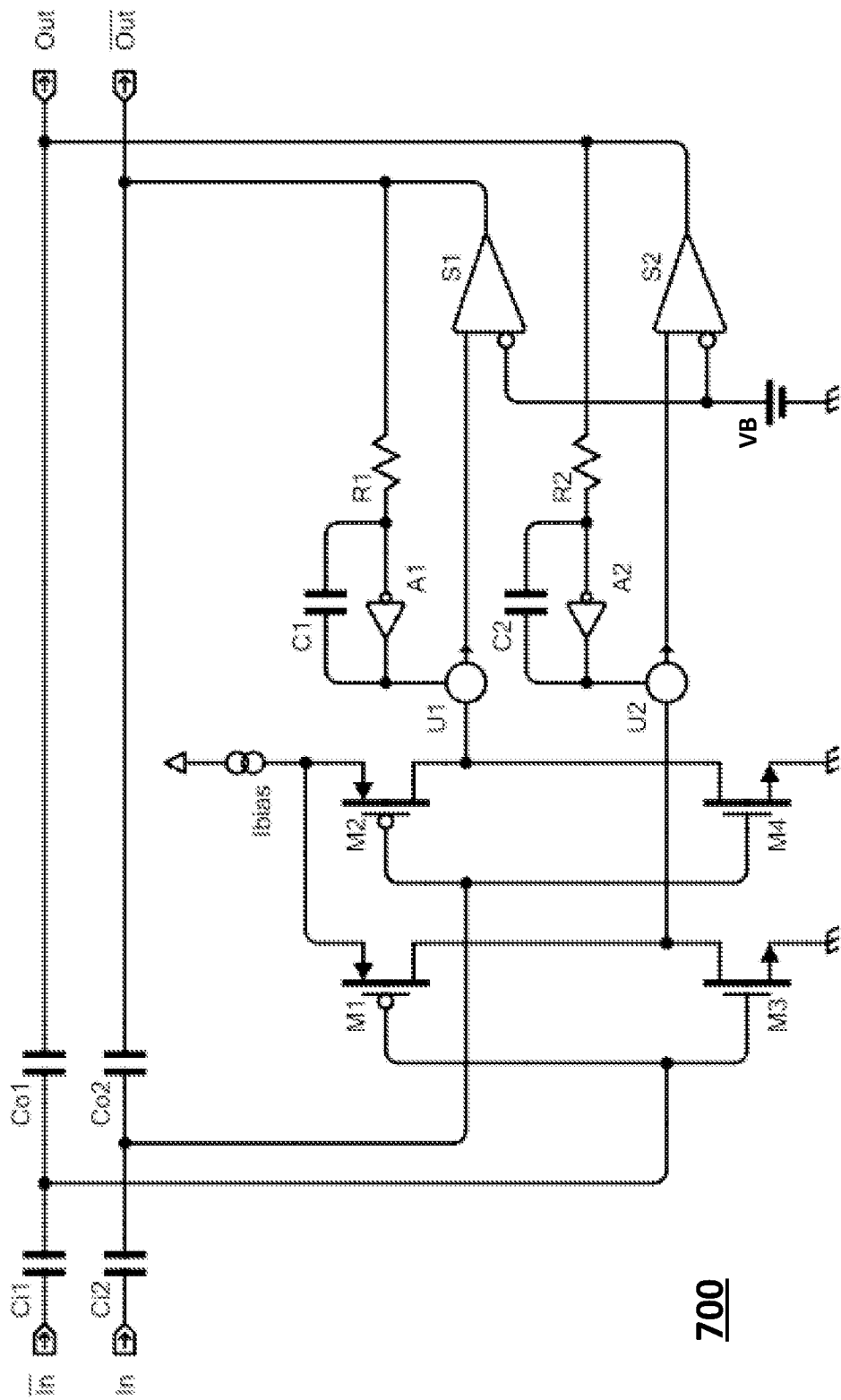
FIG. 7 is a diagram of an amplifier circuit in which quantum gate tunneling is used to control the DC value of the circuit according to another embodiment.

FIG. 7 is a diagram of an amplifier circuit 700 in which quantum gate tunneling is used to control the DC value of the circuit according to another embodiment. Circuit 700 shows the use of a no-load amplifier augmented with a tunneling current control means; this allows a charge-coupled amplifier to operate with a DC bias established without the use of inconvenient high value resistors.

Circuit 700 is different from circuit 600 in several ways. First, while circuit 600 uses tunneling currents to control the DC voltage of the circuit, it has the disadvantage that it has added two transistors, M5 and M6, that are connected to the amplifier input nodes but make no contribution to the performance of the amplifier. Circuit 700 does not have transistors M5 and M6.

Rather, circuit 700 avoids the need for extra transistors by exploiting the very problem that is being solved, i.e., that a capacitively coupled circuit does not define the common mode voltage. As a result, it is possible to choose any convenient common mode voltage as a solution. The embodiment of circuit 700 uses the gate source voltage of transistors M3 and M4, when biased at the operating input current.

This allows a "no load" amplifier to be used in which one pair of active devices, i.e., transistors M3 and M4, are connected as the "load" for the other pair, transistors M1 and M2, without the need for large resistors as are used in the prior art or any need to define the input pair tail current of transistors M3 and M4. The outputs of circuit 700 are taken at the nodes between the two pairs of amplifiers.

Second, as is apparent from FIG. 7, circuit 700 is a differential implementation of the circuit; differential circuits are often preferred in the art because they are known to improve noise rejection. The inputs are an input signal In and its inverse, commonly referred to as "In bar" or $\overline{In}$, and similarly an output signal Out and its inverse, "Out bar" or $\overline{Out}$. The output from input signal In is $\overline{Out}$, while the output from the inverse of the input signal, $\overline{In}$, is Out.

In circuit 600 of FIG. 6, the gain of the amplifier is the ratio of the capacitance values, −C1/C2. In the differential circuit 700, there are now four capacitors, two for each of the differential inputs, two input capacitors Ci1 and Ci2 and two output capacitors Co1 and Co2.

One of skill in the art will understand that the gain of each signal is determined as in circuit 600, i.e., based on the capacitors between each input and the corresponding output. Thus, the gain from input signal In to $\overline{Out}$ is −Ci2/Co2, while the gain from the inverse of the input signal, $\overline{In}$, to Out is −Ci1/Ci2. The overall gain of circuit 700 is:

$$G = \frac{Ci1 + Ci2}{Co1 + Co2}$$

Third, the mechanism of the DC voltage control is remote from the input circuit, and there are no additional devices connected to the amplifier input nodes and thus no noise or disturbance as a result of using the present approach. Circuit 700 is itself able to control the DC voltage operating point by using a variable bias applied prior to the second stage.

As above, the tunneling current of a transistor depends upon its drain to source voltage. It can be seen in circuit 700 that if any means to control the output common mode voltage of the quad input devices is used, this "input stage output common mode control" will function as a net tunneling current control at the amplifier input.

Thus, an amplifier that has competing tunneling currents at the input is needed, as well as a means to control those competing tunneling currents. This is conveniently achieved by second stage common mode control, an example of which is shown in circuit 700.

Transistors M1 and M2 form the upper PMOS input amplifier, transistors M3 and M4 are the no-load lower NMOS input amplifier. The tunneling current of transistor M1 runs in the opposite direction to that of transistor M3. Since the tunneling current is proportional to the drain-source voltage of a transistor as above, balancing the tunneling currents is accomplished by controlling the equilibrium voltage on the common drain connection of transistors M1 and M3, which is the input common mode voltage of the second stage of the amplifier. (The situation between transistors M2 and M4 is the same.)

Since the total voltage of transistors M1 and M3 is fixed by current source Ibias, the sum of the source to drain voltages of transistors M1 and M3 is fixed, but the fraction allocated to the source to drain voltage of transistor M1 (as opposed to that of transistor M3) can be controlled by the input common mode voltage of the second stage, i.e., the voltage between the drains of the two transistors. When this common mode voltage is increased, the source to drain voltage of transistor M1, and thus its tunneling current, will decrease while the drain to source voltage of transistor M3, and thus its tunneling current, will increase.

There must be enough voltage supplied to both transistor M1 and transistor M3 to support the drain source channel. A typical drain source voltage is about 350 millivolts (mV), so the total voltage for both transistors is often about 700 mV, and the common mode voltage between transistors M1 and M3 is 350 mV. However, each transistor can function with a voltage as low as 150 mV. Thus, the common mode voltage can go as low as 150 mV (so transistor M3 has enough voltage to function) or as high as 550 mV (so transistor M1 has enough voltage, i.e., 700 mV minus 550 mV is 150 mV). Thus, the common mode voltage can swing between 150 mV and 550 mV to control the tunneling currents. Further, this common mode voltage is independent of any signal processing.

To accomplish control of the common mode voltage, control stages utilize feedback of the output signals. Each control stage in circuit 700 contains a summer, a resistor, a capacitor and an amplifier (for example, one control stage contains summer U1, resistor R1, capacitor C1 and amplifier A1). Summers U1 and U2 (voltage adder means of any reasonable type known in the art) are interposed between the input stage output and the inputs to the output stages S1 and S2. The upper control ports of summers U1 and U2 receive voltage that is added to, or subtracted from, the output stage nominal bias point that is set by capacitor VB in circuit 700.

The average value of the output voltage from output stage S1 is integrated by resistor R1 and capacitor C1, and a high gain inverting amplifier A1; this integral is added to the first stage common mode output voltage. The R1 C1 time constant averages the output of S1; if it is too high, the averaging drops the voltage and acts as a control on the tunneling current. A similar operation is performed with resistor R2, capacitor C2, and amplifier A2 in the differential path. The effect of this is to balance the tunneling current of the NMOS and PMOS transistors in each leg and define the DC state of the circuit.

The DC bandwidth of each amplifier is determined by the RC constant from the resistor and capacitor in each amplifier, e.g., R1 C1 or R2C2. The noise generated by these RC combinations is much less than in the prior art because they are located after the gain of the input stage (transistors M1 through M4), unlike the prior art in which an RC constant occurs at the input of a circuit.

By combining these features, it is possible to construct a charge-coupled amplifier that can operate with a DC bias that is established without the use of inconvenient high value resistors. As described above, a circuit is constructed with a first stage in which the tunneling current is bipolar (by pairing PMOS and NMOS transistors), and a second stage with an arbitrary, controlled common mode voltage that can be used to control the common mode voltage of the circuit by controlling the first stage tunneling current. No additional elements are needed, thus avoiding any degradation of performance or power consumption of the circuit, since the input devices both process the input signal and maintain the DC operating point of the circuit.

Those skilled in the art will appreciate that circuit 700 of FIG. 7 is a differential input, differential output analog amplifier. The feedback is analog and is provided through Co1 and Co2. If the output is connected to a DAC, such that the values of feedback applied to Co1 and Co2 are quantized, the output of amplifies S1 and S2 can then activate the various states of that digital (DAC) feedback so as to maintain equilibrium (as in the analog feedback case shown). Consequently, the DAC values will represent a digital encoding of the input, benefitting from the low noise and DC control aspect of the present approach. The present approach therefore allows construction of an ADC based on the sample quantum tunneling current principle as the analog amplifier is described herein.

One of skill in the art will appreciate that, since the present approach utilizes the fact that the tunneling current is bipolar, it is possible to construct a device having the desired effect in which the types of transistors, i.e., PMOS and NMOS, shown in the embodiments above are "swapped." For example, the PMOS transistors in the upper amplifier of circuit 600 of FIG. 6 may be replaced with NMOS transistors, and the NMOS transistors in the lower amplifier of circuit 600 replaced with PMOS transistors. However, some additional changes are likely to be desirable.

Figure 8:
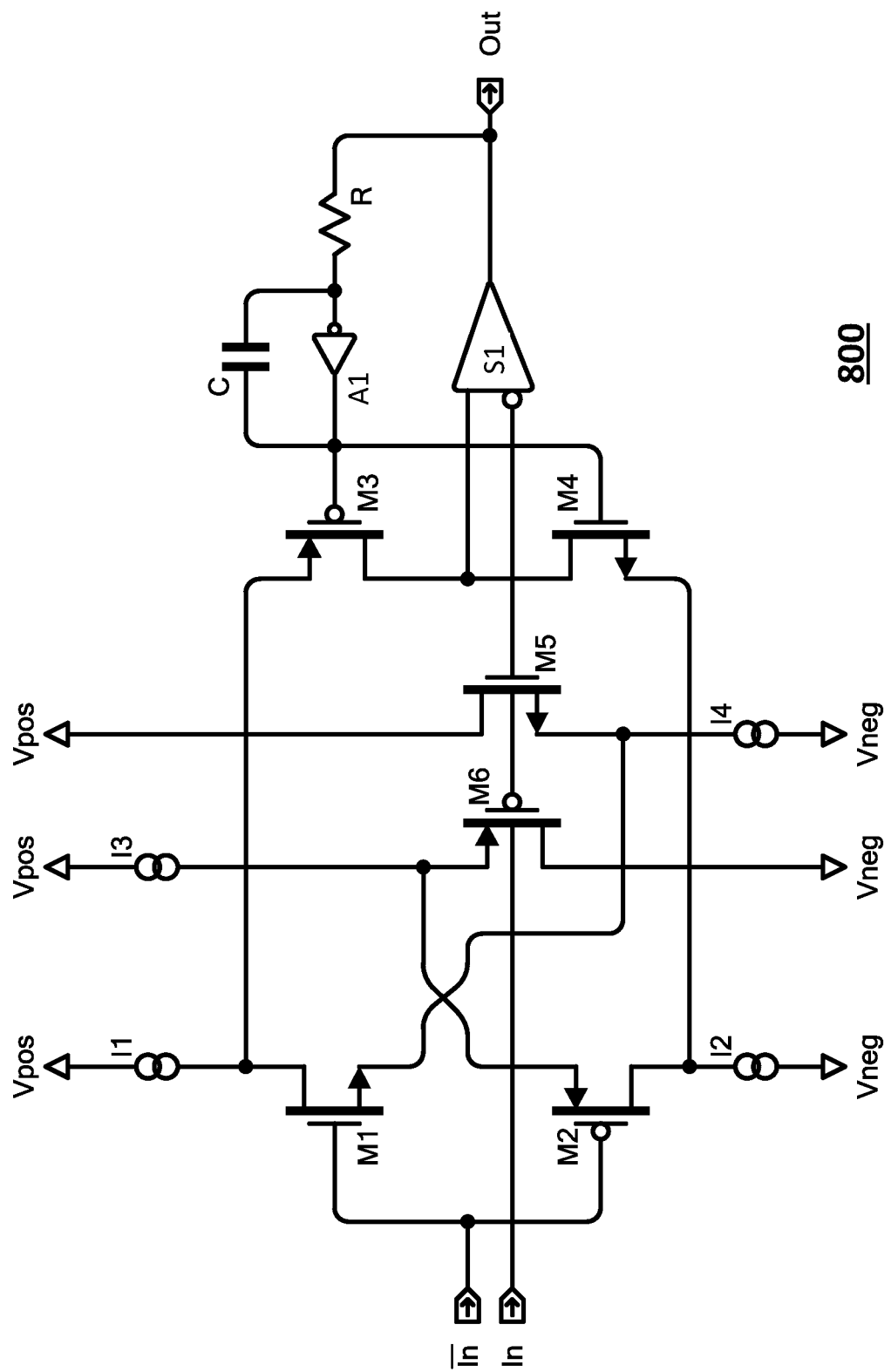
FIG. 8 is a diagram of an amplifier circuit in which quantum gate tunneling is used to control the DC value of the circuit according to still another embodiment.

FIG. 8 is a diagram of an amplifier circuit in which quantum gate tunneling is used to control the DC value of the circuit according to still another embodiment in which the PMOS and NMOS transistors are swapped in this fashion.

In circuit 800 the input stage of transistors M1 and M2 both exhibit quantum tunneling current. Transistors M3 and M4 are an intermediate second stage, and transistors M5 and M6 provide an offsetting voltage to bias the input transistors M1 and M2 to allow current to flow through transistors M1 and M2. An output stage S1 and a control circuit containing resistor R, capacitor C, and amplifier A1 function to control the common mode voltage. (No summer is needed here because in this case the output stage is now not directly connected to the input stage; rather, the output stage S1 is connected to intermediate transistors M3 and M4.)

The common gates of transistors M3 and M4 affect the source to drain voltage of transistors M1 and M2. Specifically, if the common gate of transistors M3 and M4 is at the same voltage as in the 'In' terminal, then the NMOS input transistor M1 has a drain to source voltage equal to the source to gate voltage of transistor M3 plus the source to gate voltage of transistor M5. Similarly, the PMOS input transistor M2 has a drain to source voltage equal to the source to gate voltage of transistor M4 plus the source to gate voltage of transistor M6.

If the common gate of transistors M3 and M4 is moved downward (decreased) in voltage, the drain to source voltage of transistor M1 is decreased while the drain to source voltage of transistor M2 is increased. This will therefore cause the tunneling current of transistor M2 to increase and that of transistor M1 to decrease, so that a net tunneling current will flow out of the In-bar input line.

Conversely, if the common gate of transistor M3 and M4 is moved upward (increased) in voltage the drain to source voltage of transistor M1 is increased while the drain to source voltage of transistor M2 is decreased. This will therefore cause the tunneling current of transistor M1 to increase and that of transistor M2 to decrease, so that a net tunneling current will flow into of the In-bar input line.

The control circuit (i.e., an integrator) made of R, C and A1 controls the common gate of transistors M3 and M4 and so affects the net input tunneling current. If connected to the output as shown this results in a stable, DC defined condition in the capacitive coupled amplifier as shown.

Figure 9:
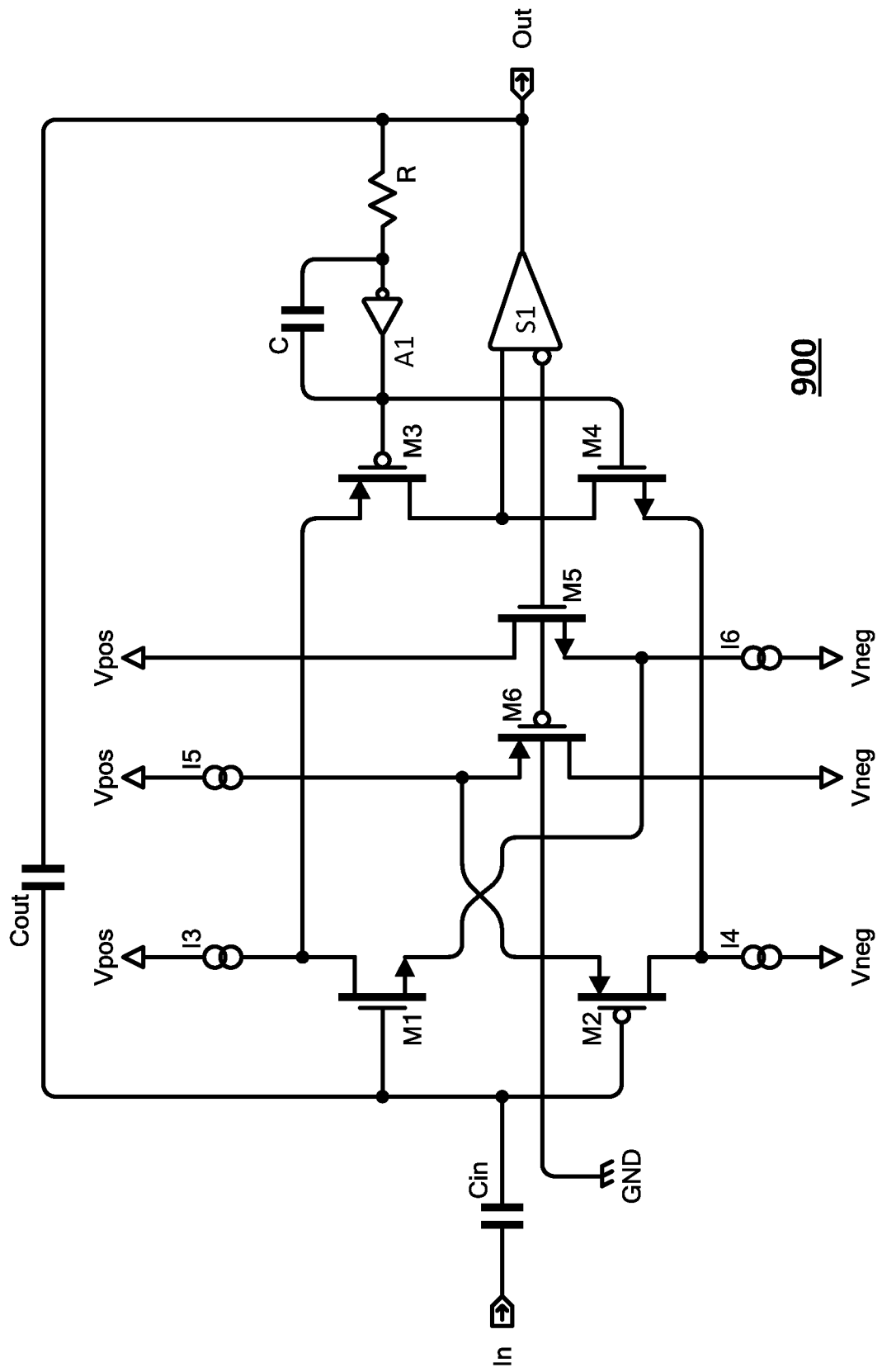
FIG. 9 is a diagram of an amplifier circuit in which quantum gate tunneling is used to control the DC value of the circuit according to still another embodiment.

FIG. 8 shows a single-ended example; to utilize this in a charge-coupled amplifier with feedback, additional capacitors between the input and output Cin and Cout are connected as shown in circuit 900 in FIG. 9.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Further, the illustration of transistors and the associated feedback loops, resistors, etc., is exemplary; one of skill in the art will be able to select the appropriate number of transistors and related elements that is appropriate for a particular application.

These and other variations upon the embodiments are intended to be covered by the present disclosure, which is limited only by the appended claims.

What is claimed is:
1. A charge-coupled amplifier circuit comprising:
   a first capacitor having a first end configured to receive an input signal and a second end;

a second capacitor having a first end coupled to the second end of the first capacitor and a second end;
a first amplifier comprising:
 a first PMOS transistor having a gate, a drain and a source, the gate and source coupled to the second end of the first capacitor and to a ground;
 a second PMOS transistor having a gate, a drain and a source, the source coupled to the source of the first PMOS transistor and the gate connected to the ground;
 an output stage having an input coupled to the drains of the second PMOS transistor and the second NMOS transistor, and an output configured to supply an output signal and coupled to the second end of the second capacitor;
a current source connected to a power supply and configured to supply current to the sources of the first and second PMOS transistors;
a second amplifier comprising:
 a first NMOS transistor having a gate, a drain and a source, the drain and the gate coupled to the drain of the first PMOS transistor and the source coupled to the ground;
 a second NMOS transistor having a gate, a drain and a source, the gate coupled to the gate of the first NMOS transistor, the drain coupled to the input of the output stage and the drain of the second PMOS transistor, and the source coupled to the ground;
wherein gate oxide layers on the PMOS and NMOS transistors are of a thickness such that current is able to flow through the gate oxide from a channel beneath the gate oxide; and
a control circuit configured to adjust the current that flows through the gate oxide of the first PMOS transistor.

2. The charge-coupled amplifier circuit of claim 1 wherein the control circuit further comprises:
 a third NMOS transistor having a gate, a drain and a source, the gate coupled to the gate of the first PMOS transistor and the source coupled to the ground; and
 a fourth NMOS transistor having a gate, a drain and a source, the gate coupled to the second end of the second capacitor, the source coupled to the drain of the third NMOS transistor, and the drain coupled to the power supply.

3. The charge-coupled amplifier circuit of claim 1 wherein the output stage comprises a push-pull driver with a nominal gain of one.

4. The charge-coupled amplifier circuit of claim 1 wherein the gate oxide layers on the PMOS and NMOS transistors are less than 2 nanometers thick.

5. The charge-coupled amplifier circuit of claim 2 wherein the gate oxide layers on the PMOS and NMOS transistors are less than 2 nanometers thick.

* * * * *